United States Patent [19]

Hamano et al.

[11] 4,419,696

[45] Dec. 6, 1983

[54] ELONGATE THIN-FILM READER

[75] Inventors: Toshihisa Hamano; Hisao Ito; Mutsuo Takenouchi; Takashi Ozawa; Mario Fuse; Takeshi Nakamura, all of Ebina, Japan

[73] Assignee: Fuji Xerox Co., Ltd., Tokyo, Japan

[21] Appl. No.: 329,471

[22] Filed: Dec. 10, 1981

[30] Foreign Application Priority Data

Dec. 10, 1980 [JP] Japan ............................. 55-173228
Jun. 1, 1981 [JP] Japan ............................. 56-82554

[51] Int. Cl.³ ............................................. H04N 1/02
[52] U.S. Cl. ............................. 358/294; 250/211 R; 250/211 J; 250/578; 338/17; 357/24; 358/213; 358/293
[58] Field of Search ............... 358/294, 293, 213; 357/24; 338/17; 250/578, 211 R, 211 J

[56] References Cited

U.S. PATENT DOCUMENTS

| 4,064,521 | 12/1977 | Carlson ................................ 357/2 |
| 4,288,702 | 9/1981 | Ozawa ............................... 250/578 |
| 4,347,436 | 8/1982 | Fukuda ............................. 250/578 |
| 4,365,274 | 12/1982 | Takenouchi ......................... 358/213 |

FOREIGN PATENT DOCUMENTS 55-23623 2/1980 Japan ................................. 358/213

OTHER PUBLICATIONS

*Optical Spectra*, May 1980, vol. 14, No. 5, pp. 51–52, "The Fiber Optic CCD Mix".
*Appl. Phys. Lett.* 36(11), (Jun. 1, 1980), pp. 919–921, "An Amorphous SiH$_x$–Ferroelectric Image Scanner", by R. A. Lemons.

*Primary Examiner*—Howard Britton
*Attorney, Agent, or Firm*—Sughure, Mion, Zinn, Macpeak, and Seas

[57] ABSTRACT

A manuscript reader comprises an amorphous silicon film sandwiched between at least one transparent electrode and a plurality of metal electrodes formed on an insulating substrate. If the reader includes a plurality of sensors, the detection circuitry can vary a comparison threshold level during the course of one scanning operation.

14 Claims, 24 Drawing Figures

ELONGATE THIN-FILM READER

BACKGROUND OF THE INVENTION

The present invention relates to a novel image reader for use in an apparatus for reading images and effecting information processing thereof, such as facsimile equipment or printers, and more particularly to a reader including, as a photoconductive element, a uniform thin film of amorphous silicon that is sandwiched between electrodes.

Semiconductor image sensors comprising charge-coupled devices (CCD) or photodiode arrays such as MOS photodiode arrays have heretofore been widely used as readers in facsimile equipment or printers. Since the known image sensors ordinarily incorporate an optical system for reducing the size of images, they may include lenses which contribute to a lengthy light path, making it difficult to achieve a small-size device.

There has recently been proposed a contact-type thin-film reader dimensioned to have the same width as that of a manuscript to be read thereby. The proposed reader is known as a planar-type reader which, as shown in FIG. 1 of the accompanying drawings, comprises an insulating substrate 1, a photoconductive layer 2 deposited thereon, and a pair of electrodes 3, 4 mounted on the photoconductive layer 2, the device thus constructed corresponding to one bit. A plurality of such devices are arranged in an array, and photoelectric currents generated by these devices upon being illuminated with light are successively detected for reading information.

With the proposed device, it is impossible to bring the electrodes 3, 4 closer than a distance of about $10\mu$ to one another, and hence the speed of response, that is, the available reading speed, is limited. For example, a time required for scanning one line on an A4 sheet is 20 msec. with a resolution of 8 elements/mm. Such a limited reading speed is too low to meet the reading requirement needed by facsimile apparatus or printers that find higher-speed applications.

The photoconductive element used in the known reader is formed of chalcogenide glass, for example, such as Se-As-Te, which will be crystallized at around 80 degrees Celsius and hence is unable to operate stably for a long period of time. Where compounds are used, it is difficult to control the amounts of components during the manufacturing process because of the complex composition, with the result that fabricated photosensitive devices have characteristics which vary from device to device.

Various devices have been developed since the published articles relating to pn control of amorphous silicon through impurity doping, that is, "Substitutional Doping of Amorphous Silicon" by W. E. Spear et al., Solid State Communications, Vol. 17, pp. 1193-1196, 1975, and "Electronic Properties of Substitutionally Doped Amorphous Si and Ge", Philosophical Magazine, Vol. 33, No. 6, pp. 935-949, 1976. For example, U.S. Pat. No. 4,064,521 to Carlson discloses a solar cell utilizing photoconductive characteristics of amorphous silicon. Efforts to develop photosensitive devices are shown in Japanese Laid-Open Patent Publication Nos. 54-150995, 55-39404, and 56-2784. The photosensitive devices incorporating amorphous silicon are advantageous in that they are more resistant to heat than those of chalcogenide glass, immune to crystallization, and can easily be pn-controlled.

Conventional photosensitive devices of amorphous silicon include semiconductive junctions such as p-i-n, p-n, or Schottky barrier junctions, and are subject to unstable photoconductive characteristics due to difficulty encountered in the control of film formation while fabricating layers of amorphous silicon. Such devices also require insulation between bit-forming photoconductive elements of amorphous silicon to prevent an inter-bit current leakage due to a low resistance of $10^4-10^6$ $\Omega$cm of an n-type layer out of these amorphous silicon layers. The known photosensitive devices also cannot meet the demand for an elongate structure or high-speed response to applied light, because of the foregoing problems experienced with the manufacturing process.

SUMMARY OF THE INVENTION

The present invention has been made with the above disadvantages in view.

It is an object of the present invention to provide a manuscript reader incorporating photosensitive elements of amorphous silicon capable of high-speed reading operation along an elongate zone.

Another object of the present invention is to provide a novel reader having a faster response to light, comprising photosensitive elements which are of relatively uniform sensitivities, operable stably for an increased period of time, and easy to fabricate.

The above objects can be achieved by providing an elongate thin-film reader comprising an insulating substrate, a plurality of metal electrodes each for one bit, a layer of amorphous silicon deposited flatwise on the plurality of metal electrodes, and a transparent electrode deposited flatwise on the amorphous silicon layer in opposite relation to the plurality of metal electrodes. The layer of amorphous silicon is preferably of i-type or p-type. In order to achieve accurate binary conversion of the analog output voltages from the sensors, individually adjustable threshold voltages may be provided.

BRIEF DESCRIPTION OF THE DRAWINGS

The present invention will be described in detail with reference to the accompanying drawings, in which:

FIGS. 3A, 3B, 3C and 3D are views showing a variety of patterns in which lower metal electrodes are arranged; of which FIG. 3A shows electrodes arranged in a row with leads therefor arranged on one side of the array, FIG. 3B shows a pattern in which the electrodes are arranged in two rows with electrode positions along the array alternating between rows, FIG. 3C shows a pattern composed of two rows with electrodes in the two rows being arranged side by side, and FIG. 3D shows a pattern composed of two rows with electrodes in each row arranged in pairs with pair positions alternating between rows along the array;

DETAILED DESCRIPTION OF THE INVENTION

Figure 1:
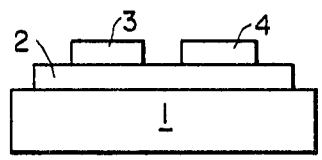
FIG. 1 is a schematic view showing a conventional planar type reader device.
Figure 2:
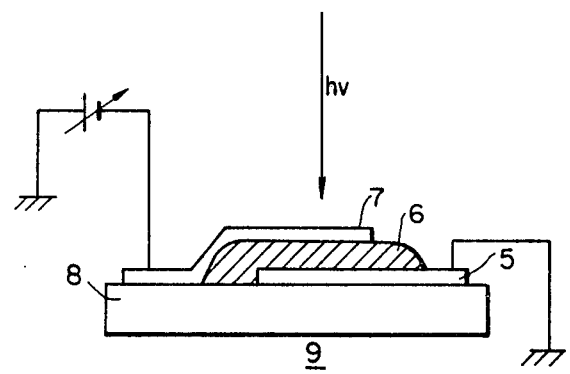
FIG. 2 is a cross-sectional view of a reader device according to the present invention.

As shown in FIG. 2, a reader device 9 according to the present invention comprises an insulating substrate 8, a lower metal electrode 5 deposited on the insulating substrate 8, a layer of amorphous silicon 6 deposited on the lower metal electrode 5, and an upper transparent electrode 7 deposited on the layer of amorphous silicon.

The insulating substrate 8 may be made of any material which has a relatively high mechanical strength and is a good insulator, such as ceramics, glass, or plastics, for example. The insulating substrate may be used as it is, or may be glazed for improved smoothness, or may be provided with a deposited substance which will enable stronger adhesion to the lower metal electrode or will improve the electrical characteristics of the lower metal electrode.

Figure 3A:
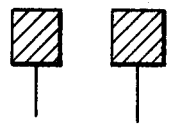
Figure 3B:
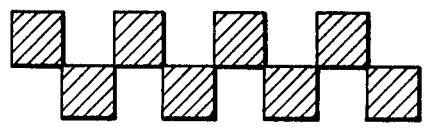
Figure 3C:
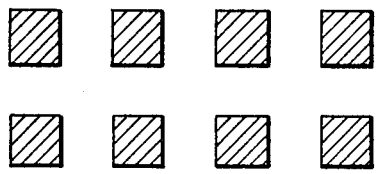
Figure 3D:
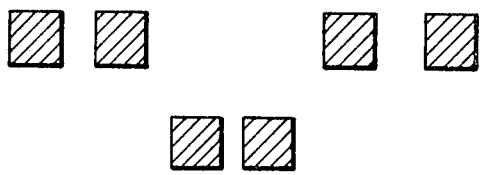

The lower metal electrode 5 is composed of a plurality of electrode members corresponding to bits required for reading information. The lower electrode members are preferably arranged in a row as shown in FIG. 3(a) with lead wires attached thereto at a desired side of the row of electrode members. As illustrated in FIGS. 3(b) through 3(d), the lower electrode members may be in a plurality of rows with lead wires (not shown) arranged in a manner similar to the pattern shown in FIG. 3(a).

Figure 4:
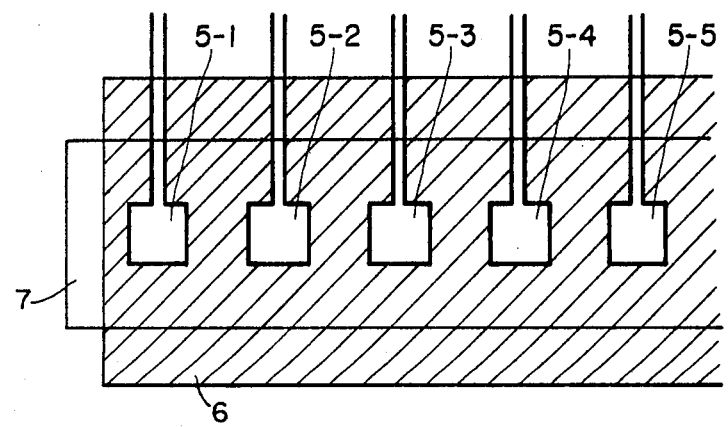
FIG. 4 is a view illustrating the reader device of the invention as seen from an upper transparent electrode.
Figure 5:
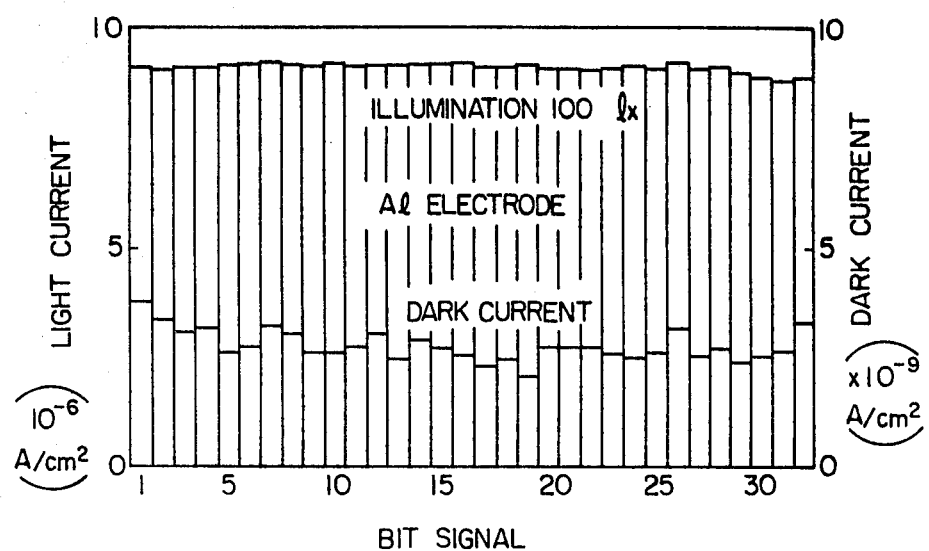
FIG. 5 is a graph showing a relationship between bit signals and photoelectric outputs in the device according to the present invention.

The lower electrode members 5-1 through 5-5 may be of a square shape as shown in FIG. 4, or of other desired shapes. Photosensitive regions are defined by areas in which the lower electrode members and the transparent electrode are superimposed with the amorphous silicon layer interposed therebetween.

The lower metal electrode 5 may be made of various materials such as Cr-Au (in two layers), Ni, Al, Cr, Pt, Pd, Mo, or Ti.

The layer of amorphous silicon can be deposited uniformly by plasma CVD, sputtering, or vapor deposition, and is preferably not doped. If it is to be doped, it can be made i-type by doping with a small amount of hydrogen, or p-type by doping with boron or elements in Group III of the Periodic Table. The amorphous silicon layer thus formed is uniform and should have a thickness which ranges from 0.5 $\mu$m to 5 $\mu$m. The amorphous silicon layer is preferably of a single coating covering all of the lower metal electrode members which serve as photosensitive elements. The layer of amorphous silicon formed should have a volume resistivity of $10^{10}$ $\Omega$cm or higher, and preferably $10^{12}$ $\Omega$cm or higher.

The upper transparent electrode 7 is preferably comprised of a film of ITO ($In_2O_3 + SnO_2$) with a suitable ratio between the amounts of these elements. The layer of ITO is preferably of a thickness ranging from 500 to 2,000 Å, and covers the layer of amorphous silicon at least in the areas over the lower metal electrode members. Thus, the lower metal electrode, the layer of amorphous silicon, and the upper transparent electrode jointly form a photosensitive device or a group of photosensitive devices of a sandwiched construction. The amorphous silicon layer should be so deposited as to avoid direct contact between the lead wires connected to the lower metal electrode members and the upper transparent electrode.

The positions of the metal electrode and the transparent electrode may be reversed from that in the illustrated structure.

Figure 6:
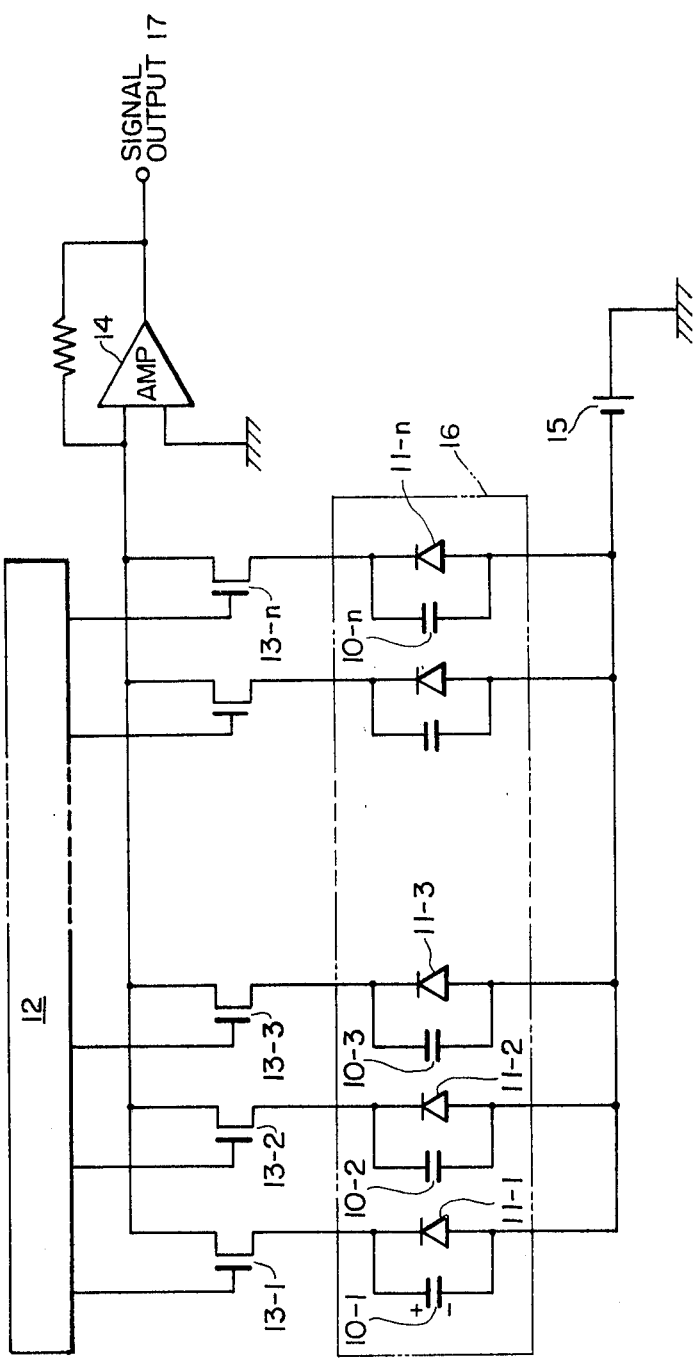
FIG. 6 is an equivalent circuit diagram of photosensitive devices in accordance with the present invention.

Operation of the photosensitive device according to the present invention will be described with reference to FIG. 6 which shows an equivalent circuit.

The photosensitive elements 9 shown in FIG. 2 are equivalent to parallel-connected circuits of capacitors 10 (10-1, ..., 10-n) and diodes 11 (11-1, ..., 11-n). The capacitors 10 have a capacitance created by the lower metal electrode 5, the layer of amorphous silicon 6, and the upper transparent electrode 7, the capacitance including capacitances between the lead wires. The diodes 11 (11-1, ..., 11-n) are constituted by the layer of amorphous silicon. Each of the read devices composed of the capacitors 10 and the diodes 11 corresponds to one bit in one line, and the read devices are provided for the extent of one line. A manuscript or an object to be read can thus be read by scanning the line of read devices.

As switching devices 13-1 through 13-n, such as CMOS, are successively energized by a shift register 12, the read devices 10, 11 are sequentially grounded through an operational amplifier 14. The terminals of the read devices 10, 11 remote from the operational amplifier 14 are connected to a biasing power supply 15 through the upper transparent electrode.

At the time of starting scanning operation, the read devices 10, 11 are free of electric charges therein. All of the switches 13-1 to 13-n are then turned on, allowing currents to flow from the amplifier 14 through the switches 13-1 to 13-n to charge the capacitors 10-1 to 10-n, but these currents are not considered to be read signals. Under this condition, the upper side of each capacitor will be substantially at ground potential while the lower side is negative. Upon the scanning entering a line to be read, and provided a portion of the manuscript which positionally corresponds to the capacitor 10-1 is white, the corresponding layer of amorphous silicon is rendered conductive, thereby permitting a current to flow from the higher potential side of the capacitor to the biasing power supply 15 to thereby discharge the capacitor 10-1. The drop in potential will be communicated through the switch 13-1 to be detected by the operational amplifier 14.

When the switch 13-2 is energized by the shift register 12 with the capacitor 10-2 corresponding in position to a black portion of the manuscript, the amorphous silicon remains non-conductive and the capacitor 10-2 remains charged with electric charges supplied during a previous cycle of operation. Thus, no current signal is fed to the operational amplifier 14. The line is successively scanned in this manner, and so are subsequent lines.

Upon scanning one line with the shift register 12, all photosensitive elements are charged again in preparation for reading a next line. The photosensitive elements are kept illuminated by a source of light, which would tend to discharge the capacitors that correspond to white image portions of the line that has just been read. However, the amount of discharge due to being illuminated with light while staying on the previous line that has been read can be reduced to a negligible degree by simultaneously reading all elements at the end of a line scan just before shifting to the next line.

Examples of the reader device of the invention will be described in detail.

EXAMPLE 1

The substrate was formed of glass or glazed ceramics, and the lower electrode was in the form of a layer of Cr having a thickness of about 3,000 Å prepared by electron beam vapor deposition, with a predetermined pattern defined through photolithography. (While in this example Cr was used, other materials such as Ti, Mo, Ni-Cr, Al, Au, Pt, may be employed for the lower electrode.)

A film of amorphous silicon having a thickness of about 1 $\mu$m was formed by glow discharge through a silane gas under the conditions that the substrate temperature (Ts)=200-300 degrees Celsius, the discharge pressure (p)=0.2-1 Torr, the inter-electrode distance (d)=20-50 mm, the RF power (P)=10-100 W, and the rate of flow of gas (r)=10-50 SCCM ($SiH_4$). The film was formed and deposited in about one hour. The upper transparent electrode was formed with ITO ($In_2O_3$, $SnO_2$) in a thickness of about 1,500 Å by DC sputtering with −5 volts using a reactive gas or Ar+$O_2$ (partial pressure of $O_2$ being $1.5 \times 10^{-4}$ Torr) and also using a metal mask. The device thus fabricated was incorporated in the circuit shown in FIG. 6 for a test of reading capability. The device was able to read information at a rate of 10 ms/line (A4 sheet).

No reduction in reading capability of the sensor was caused by heating up to 300 degrees Celsius. Thus, the reader device proved highly thermally stable.

EXAMPLE 2

A photoconductive layer of amorphous silicon was doped with 10 ppm of boron, and the resultant layer had substantially the same characteristics as those of an i-type layer. The amorphous silicon layer was deposited in about 1.2 hours under the same conditions as Example 1 using a gas 100 ppm $B_2H_6$ with $SiH_4/H_1=1$.

EXAMPLE 3

The lower metal electrode 5 was made of Cr-Au, and the upper transparent electrode 7 was formed of ITO (10 mol% $In_2O_3$+90 mol% $SnO_2$).

A metal electrode film was grown by depositing a layer of Cr in a thickness of up to 500 Å and a layer of Au in a thickness of up to 800 Å on a glass substrate 8 kept at a temperature of 250 degrees Celsius. Then, the layers of Au and Cr were etched by photolithography to define a predetermined metal electrode pattern. An i-type amorphous silicon film was deposited in a thickness of about 1 $\mu$m through glow discharge in a gas of $SiH_4$ mixed with a small amount of hydrogen under the conditions that the RF power=20-50 W, the rate of flow of the gas=20-50 SCCM, the pressure=0.4-0.6 Torr, the substrate temperature=200-300 degrees Celsius, and the inter-electrode distance=40 mm, the deposition process being carried out for 30 minutes to 1 hour. Subsequently, the upper transparent electrode 7 was formed of ITO and deposited in a thickness on the order of 1,500 Å by DC sputtering for 10 minutes under the conditions that the power=170-200 W, the oxygen partial pressure=$1.5 \times 10^{-4}$ Torr, and the total pressure (oxygen+argon)=$4 \times 10^{-3}$ Torr.

Figure 7:
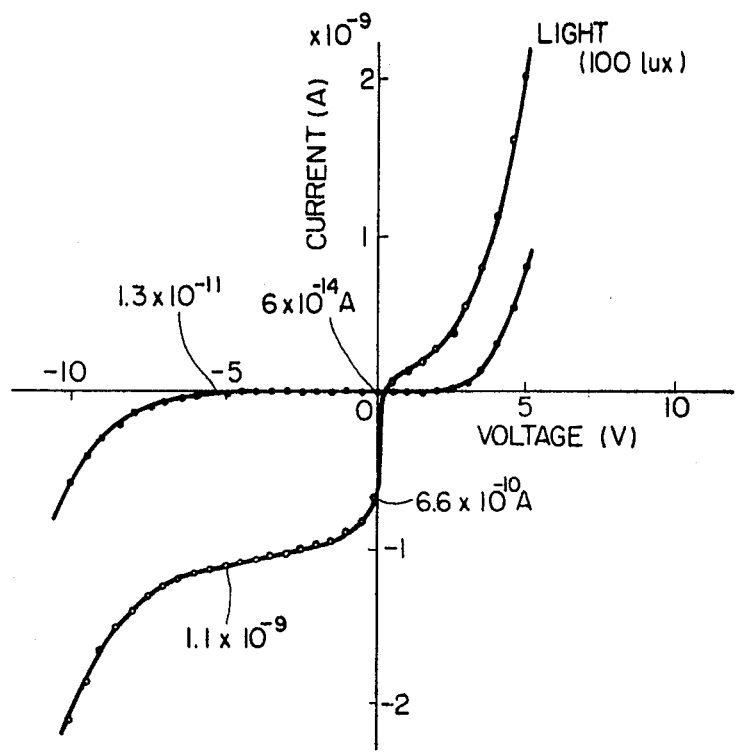
FIG. 7 is a graph illustrative of photoelectric currents produced under light and dark conditions when the biasing voltage is varied.

FIG. 7 shows current vs. voltage characteristics of a sensor thus prepared. Currents under light and dark conditions at 0 volt were $6.6 \times 10^{-10}$ A (per 100 lux) and $6.0 \times 10^{-14}$ A, respectively, for a light-receiving area of 100 $\mu$m $\times$ 100 $\mu$m, resulting in a ratio of 11,000 between the currents. This result indicates that the sensor is highly effective in operation with a bias of 0 V or no biasing. In actual practice, a slight biasing voltage is applied since a photoelectric current is employed.

EXAMPLE 4

The lower metal electrode was made of Al and was patterned. The patterned electrode was baked in a furnace to grow an oxidized layer on the metal surface up to a thickness of 20 Å. On the oxidized layer, there was deposited amorphous silicon in a thickness of about 1 $\mu$m by way of glow discharge, thus forming a photoconductive layer. The layer of amorphous silicon was a single coating of i-type or light n-type which was not doped, or of the light p-type which was doped with a small amount of boron (10 to 1,000 ppm). The amorphous silicon film was prepared by a reactive sputtering process. The transparent electrode was formed of ITO deposited on the amorphous silicon layer by way of high-frequency sputtering. The transparent electrode serves as an electrode to which a negative bias voltage is applied.

With this arrangement, the oxidized layer on the surface of the lower aluminum electrode serves as a layer to block injection of holes from the aluminum electrode and hence to reduce a dark current, resulting in a high light-dark ratio.

Figure 8:
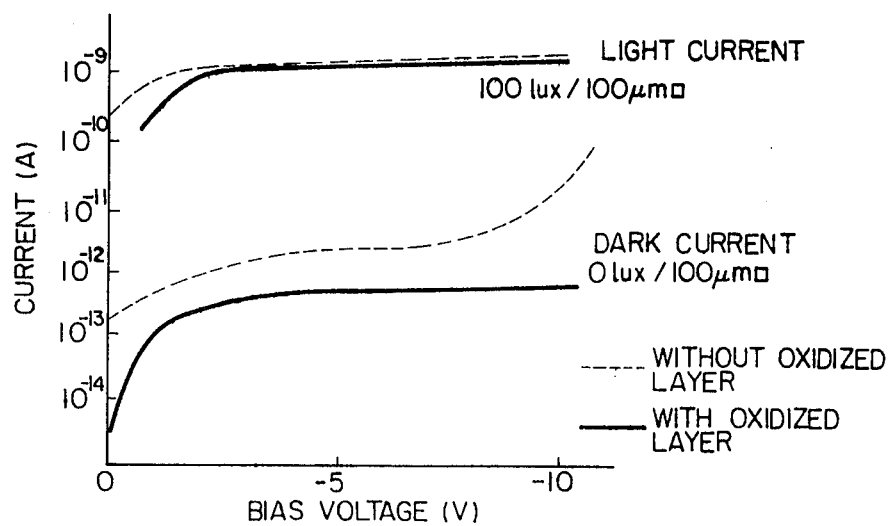
FIG. 8 is a graph showing characteristics available when there is an oxidized aluminum layer and when there is no such oxidized aluminum layer.

The arrangement of the present example shows a greater advantage as the bias voltage is increased. FIG. 8 illustrates a difference between operation with an oxidized aluminum layer and that with no oxidized aluminum layer, the driving bias being −5 V for reading operation. A study of FIG. 8 indicates that the addition of an oxidized aluminum layer can increase the light-dark ratio by a significant amount. For example, a metal electrode of aluminum with no oxidized layer offers a light-dark ratio <1,000, but the same electrode with an oxidized layer results in a light-dark ratio ≳2,000.

According to another example, the lower electrode is formed of Cr, instead of Al. The surface of the electrode of Cr is flatter than that of Al, and a layer of amorphous silicon as deposited on the electrode of Cr has a good surface condition, resulting in a lesser tendency to produce defective bits. With an oxidized layer of Cr, the dark current produced is smaller than that generated with a layer of oxidized aluminum, and a light-dark ratio ≳3,000 results.

While the oxidized layer in the above example was prepared by forcibly oxidizing the lower metal electrode by way of a direct thermal oxidiation or anode oxidization process, the layer may be oxidized through natural oxidization or using a variety of oxidizing agents.

With the arrangement of the foregoing example, an oxidized layer formed on the surface of a lower metal electrode can prevent holes from being injected from the lower metal electrode, thereby attaining a high light-dark ratio.

Briefly summarized, the present invention as exemplified in the above embodiment is characterized by a plurality of metal electrode members deposited on an insulating substrate and divided into individual bits, a layer of amorphous silicon deposited flatwise on the plurality of metal electrode members, and a transparent electrode deposited flatwise on the layer of amorphous silicon in opposing relation to the divided metal electrode members.

The layer of amorphous silicon may be of the i-type or p-type for an increased dark resistance. The photoconductive layer of amorphous silicon may be of a thickness of 0.5 to 5 $\mu$m, or preferably of 1 $\mu$m, so as to reduce the inter-electrode distance by more than half that of conventional planar type devices, with the result that the reader will have an increased response speed.

By making a plurality of lower electrode members of Cr, or oxidizing the surface of the lower electrode which is in contact with the amorphous silicon layer, the surface held against the amorphous silicon can serve as a blocking layer for holes, resulting in a reduced dark resistance. In addition, the rising or falling speed of a light signal can be reduced to 0.1 msec. or below.

The reader device according to the present invention thus has the following outstanding advantages.

With the reader device being thus simply constructed, variations in reading signal currents flowing between the bits are reduced from ±10% or higher (which is experienced conventionally) down to ±5%. This reduction of current variations allows easy establishment of a threshold level for stabilizing signals.

The device can easily be fabricated simply by depositing a layer of amorphous silicon and a layer of ITO successively, resulting in a reduction in the cost of manufacture.

A review of FIG. 7 which illustrates applied voltage vs. output current characteristics of the reader device shows that the device can be driven at a low voltage ranging from 0 to −10 V. It should be particularly noted that a light-dark ratio at the 0 V biasing voltage is in the range from 5,000 to 12,000 which is much higher than that of conventional p-i-n type photosensitive devices which ranges from 50 to 100. The response at the time of rising and falling of signals is 0.2 msec. or less, or 0.1 msec. or less where conditions are better, and hence is faster than the prior response that is in the range from 0.5 to 1 msec.

The read device according to the present invention has a photosensitivity which is about 10 pA/lux (100 $\mu$m×100 $\mu$m), which is close to twice that of conventional devices of Se-Te.

The amorphous silicon employed in the present invention is of i-type or of p-type doped with elements such as boron in Group III of the Periodic Table. Since materials of these types have a volume resistivity of $10^{10}\Omega$cm or higher, substantially no leakage occurs between bits. The volume resistivity of a preferred example of the invention is $10^{12}\Omega$cm or higher. This permits the upper transparent electrode and the amorphous silicon layer to be in single layers, respectively, which can be easily fabricated.

The reader device of the present invention was able to read information at a rate of 10 ms. or below across the width of an A4 sheet (210 mm) with the pitch of 8 lines/mm.

A manuscript reader according to another embodiment will be described with reference to FIG. 9. The manuscript reader comprises reader devices 109 which are basically of the same construction as that of the device shown in FIG. 4. More specifically, a plurality of lower metal electrodes 102-1, 102-2, . . . , 102-n are deposited on an insulating substrate 101, and a layer of amorphous silicon 107 is deposited as a flat sheet so as to cover ends of the lower metal electrodes 102-1, 102-2, . . . , 102-n. On the layer of amorphous silicon 107, there is formed an upper transparent electrode 108 in confronting relation at least to those ends of the lower metal electrodes 102-1, 102-2, . . . , 102-n which are covered by the amorphous silicon. The upper transparent electrode is also in the form of a flat sheet. The lower metal electrodes 102-1, 102-2, . . . , 102-n and the upper transparent electrode 108 opposite thereto with the layer of amorphous silicon 107 interposed therebetween jointly define the read devices 109-1, 109-2, . . . , 109-n. A lead electrode 103 is connected to the upper transparent electrode 108.

The lower metal electrodes 102-1, 102-2, . . . , 102-n extend on the insulating substrate 101 and have other end portions covered by an insulating film 104. To group the lower metal electrodes in blocks, the insulating film 104 has through-holes such that the through-holes are defined along straight lines (or other lines) which are assigned respectively to the lower metal electrodes 102-1, 102-7, . . . , the lower metal electrodes 102-2, 102-8, . . . , the lower metal electrodes 102-3, 1029-, . . . , the lower metal electrodes 102-4, 102-10, . . . , the lower metal electrodes 102-5, 102-11, . . . , the lower metal electrodes 102-6, 102-12, . . . , as thus combined. Common electrodes 106-1 through 106-6 are formed on and extend over the through-holes in the insulating film 104 to divide the lower metal electrodes 102-1 through 102-n into the groups through the through-holes and the common electrodes 106. Thus, the lower metal electrodes are grouped into a plurality of blocks such that they are divided into successive odd-numbered groups and successive even-numbered groups. The common electrodes, 106-1, 106-2, 106-3, for example, can be driven independently of each other.

The read devices 109 are also divided by light sources into groups such as 109-1 through 109-3, 109-4 through 109-6, etc. Thus, the read devices 109 are classified into blocks by the light sources and into other blocks by the common electrodes.

Figure 9:
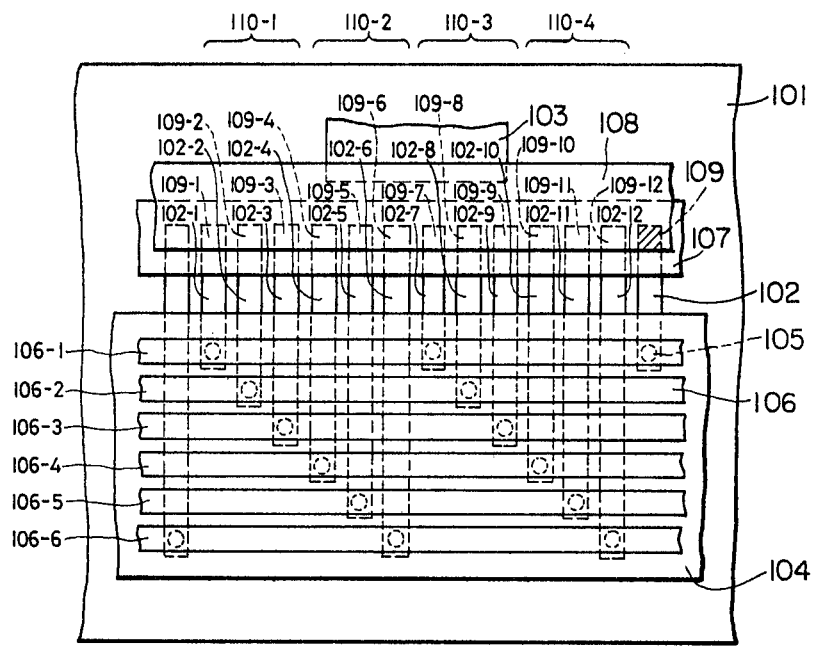
FIG. 9 is a plan view of a second arrangement for driving photosensitive devices according to the present invention.
Figure 10:
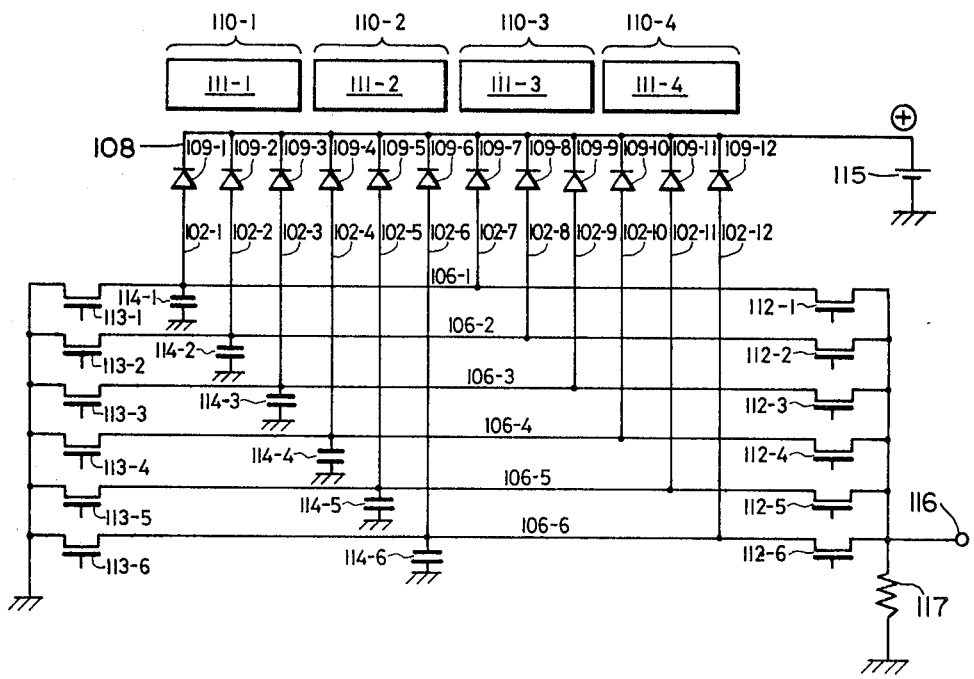
FIG. 10 is a circuit diagram of an equivalent circuit for the arrangement shown in FIG. 9.

FIG. 10 is a circuit diagram of the reader shown in FIG. 9. The circuit shown in FIG. 10 will function in the same manner as that of the circuit illustrated in FIG. 6, for charging of capacitors and simultaneous information reading operation.

Operation of the manuscript reader of FIG. 9 will now be described with reference to FIG. 10. For the sake of clearer illustration, the manuscript is not shown in FIG. 10. The read devices 109-1 through 109-12 have cathodes connected to the transparent electrode 108 and are supplied with a positive voltage from a biasing power supply 115.

Sequence 1:

Switches 112-1 through 112-6 are turned off, switches 113-1 through 113-3 are turned off, and switches 113-4 through 113-6 are turned on. When a light source 111-1 is lighted, a portion of the manuscript which corresponds to a block 110-1 is illuminated, and its image is projected onto the read devices 109-1 through 109-3. The read devices 109-1 through 109-3 that are connected to the biasing power supply 115 produce photoelectric currents dependent on the shade of the image, which are delivered by the lower metal electrodes 102-1 through 102-3 to charge capacitors 114-1 through 114-3, respectively. These capacitors may comprise wiring capacitances of the common electrodes 106-1 through 106-6, or a combination of input capacitances of the switches 112, 113-1 through 113-6 and wiring capacitances of the common capacitances of the common electrodes 106-1 through 106-6. An image of the manuscript may be projected by a leakage of the illumination light onto the photosensitive devices 109-4 through 109-6 in an adjacent block 110-2, thus causing these devices to produce photoelectric currents. With the switches 113-4 through 113-6 closed, however, no charges are stored in capacitors 114-4 through 114-6.

Sequence 2:

The light source 111-1 is de-energized upon elapse of a predetermined interval of time, and the switches 112-1 through 112-3 are successively closed. The capacitors 114-1 through 114-3 are successively discharged to enable an output terminal 116 to produce outputs having magnitudes corresponding to the amounts of charges stored on each capacitor. Reading operation for the block 110-1 is thus completed.

Sequence 3:

The switches 113-1 through 113-3 are turned on, the switches 113-4 through 113-6 are turned off, the switches 112-1 through 112-6 are turned off, and a light source 110-2 is energized. The same process as in the sequences 1 and 2 is effected for a block 110-2 for the reading operation therefor. The above operation will be carried out sequentially for subsequent blocks to read the manuscript.

The sequences 2 and 3 may be overlapped in time in which case the capacitors 114-1 through 114-3 in the block 110-1 are discharged for reading information contained therein while the block 110-2 is being subject to charge-storing operation. With this arrangement, outputs are available continuously without interruptions in time.

Figure 11:
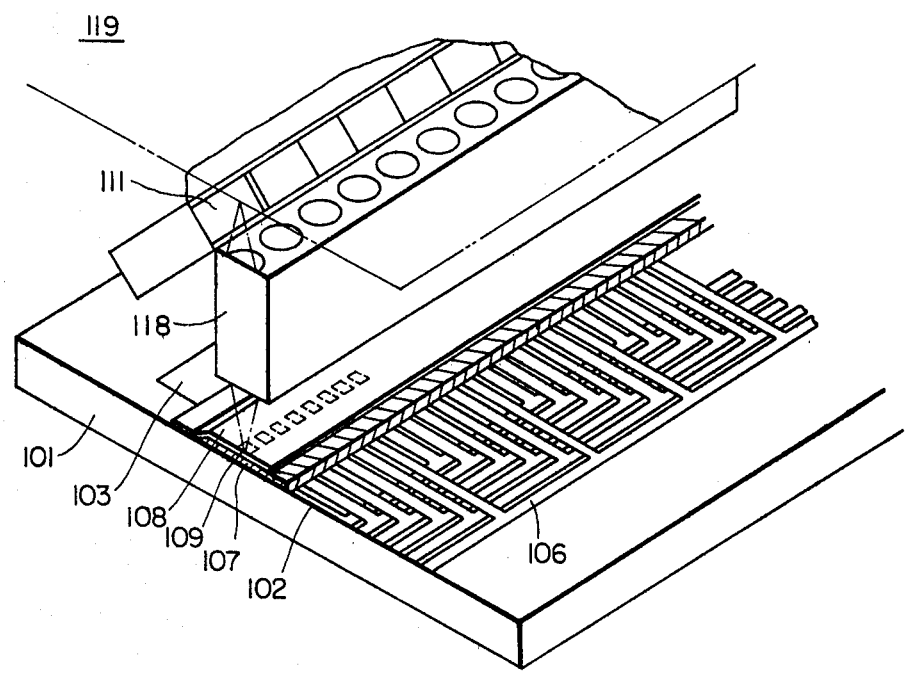
FIG. 11 is a perspective view of an optical system employed in the driving arrangement.

An illumination system for the manuscript reader will now be described with reference to FIG. 11.

An image of a manuscript 119 is focused on the photosensitive devices 109 through an optical system 118 composed of an array of optical fibers or lenses for projecting images without magnification or reduction in size. A source of light 111 is disposed adjacent to the optical system 118 in the vicinity of the manuscript 119, and comprises light-emitting diodes or small lamps which are divided into blocks as shown that can be energized independently of each other. Alternatively, the face of the light source 111 which is directed to the manuscript 119 may be composed of the ends of optical fibers that can transmit light from a light source located separately to illuminate the manuscript through a selected optical fiber block or group.

With the illustrated arrangement, the read devices 109 can be driven in the pattern of a matrix, and hence switches required for reading a manuscript can be reduced in number. I.e., as shown in FIG. 10, devices 109-1, 109-7, 109-13, etc., all show the same switches 113-1 and 112-1. Also, switches 113-1 through 113-3, and similar groups of switches, are operated simultaneously to reduce the driving circuit completely. Thus, the manuscript reader of the invention can be manufactured inexpensively. In addition, the light sources can be energized separately in blocks on a time-sharing basis, resulting in a smaller power requirement.

Figure 12A:
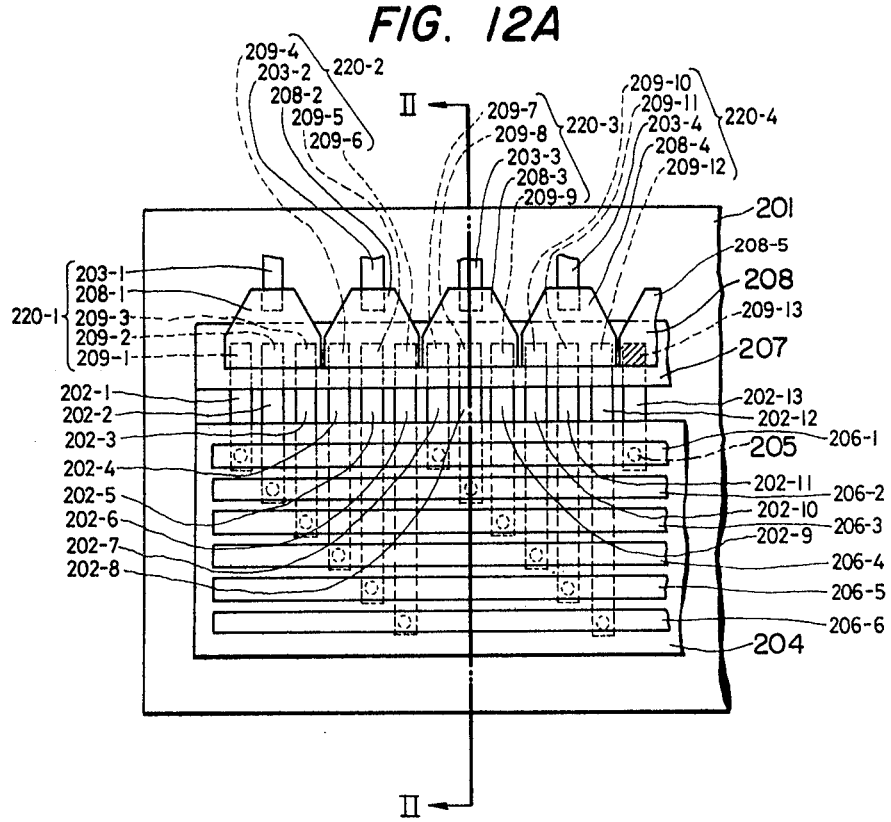
FIG. 12(A) is a plan view of a third arrangement for driving photosensitive devices of the present invention.
Figure 12B:
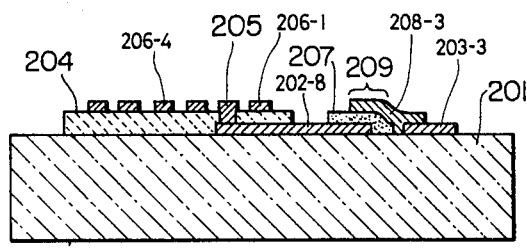
FIG. 12(B) is a cross-sectional view taken along line II—II of FIG. 12.

According to still another embodiment of the present invention, upper transparent electrodes are grouped into blocks as shown in FIGS. 12(A) and 12(B).

In FIGS. 12(A) and 12(B), photosensitive devices 209 are composed of the upper transparent electrodes 208, a layer of amorphous silicon 207, and lower metal electrodes 202. The upper transparent electrodes 208 are in the form of conductive films each connected at a top end to a lead electrode 203, and are overlapped at lower ends with the lower metal electrodes 202, with the amorphous silicon layer 207 interposed therebetween. In FIG. 12(A), one of the transparent conductive thin films 208 is shown for brevity as overlapping three adjacent lower metal electrodes 202, thus constituting a single block. Lower metal electrodes 202-1, 202-2, 202-3 in an odd-numbered block 220-1 are connected respectively by common electrodes 206-1, 206-2, 206-3 to corresponding lower metal electrodes 202-7, 202-8, 202-9 in another odd-numbered block 220-3. Likewise, lower metal electrodes 202-4, 202-5, 202-6 in an even-numbered block 220-2 are connected respectively to lower metal electrodes 202-10, 202-11, 202-12 in another even-numbered block 220-4 by common electrodes 206-4, 206-5, 206,6, respectively.

Figure 13:
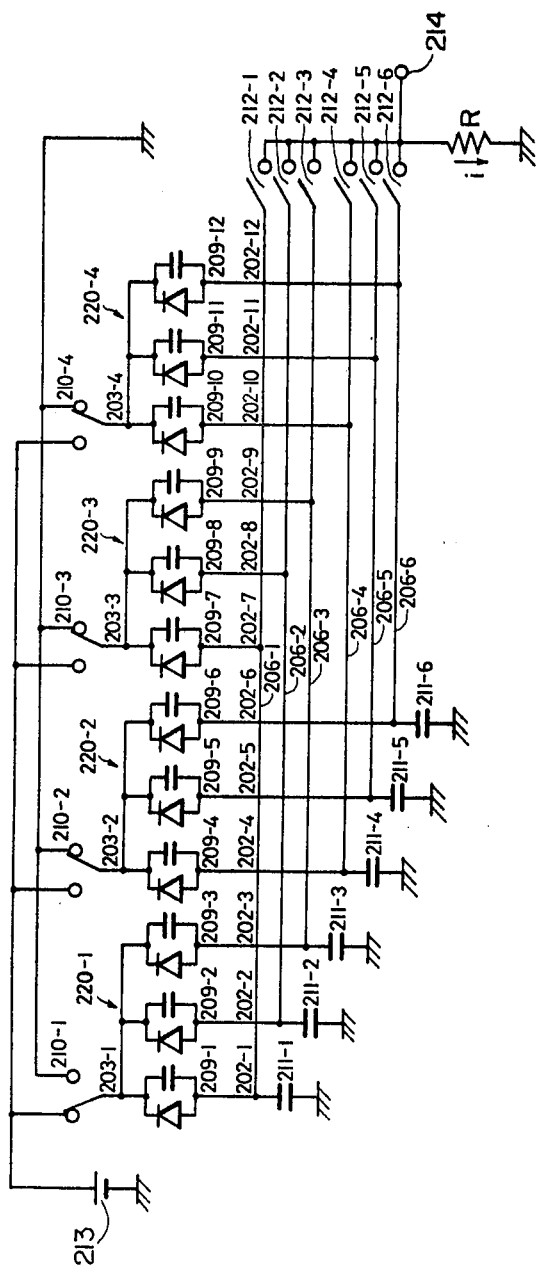
FIG. 13 is a circuit diagram of an equivalent circuit for the driving arrangement shown in FIG. 12.

FIG. 13 is an equivalent circuit diagram of a circuit arrangement for driving the image pickup device shown in FIGS. 12(A) and 12(B). Identical or corresponding parts are denoted by identical corresponding reference numerals throughout FIGS. 12(A), 12(B), and 13.

Designated at 210-1 through 210-4 are switches for applying a voltage, 211-1 through 211-6 wiring capacitances, 212-1 through 212-6 switches for reading information, 213 a power supply, and 214 a reading output terminal.

The lead electrodes 203-1 through 203-6 are connected to the voltage applying switches 210-1 through 210-4, respectively, and the common electrodes 206-1 through 206-6 are connected to the reading switches 212-1 through 212-6, respectively.

A manuscript will be read by the image pickup device thus constructed as follows.

The voltage applying switch 210-1 in a first block is connected to a positive bias terminal, and the voltage applying switches 210-2 through 210-4 in other blocks are grounded, as illustrated, with the reading switches 212-1 through 212-6 being held open. Upon illumination of the manuscript with light, the photosensitive devices 209-1 through 209-3 that are connected to the power supply 213 generate photoelectric currents which charge the capacitors 211-1 through 211-3. The capacitors 211-1 through 211-6 are composed of distributed capacitances of the common electrodes 206-1 through 206-6 and input capacitances of the reading switches 212-1 through 212-6, as combined. After the capacitors have been sufficiently charged, the voltage applying switch 210-1 is shifted to the grounding terminal to retain the charges, and the reading switches 212-1 are successively closed to allow the stored charges to flow through the closed switches to the output terminal 214 from which the charges can be picked up for information reading. The manuscript can thus be read through the photosensitive devices 209-1 through 209-3 in the first block.

Simultaneously with grounding of the voltage applying switch 210-1, the voltage applying switch 210-2 in the second block is connected to a positive bias terminal for permitting charges generated by the photosensitive devices 209-4 through 209-6 to be stored in the capacitors 211-4 through 211-6.

The foregoing operation will be repeated for each block until the manuscript is read through all of the photosensitive devices 209-1 through 209-12.

Figure 14A:
FIG. 14(a) illustrates a signal to be read.
Figure 14B:
FIG. 14(b) shows a signal generated from a device which is not driven by the driving arrangement of the invention.

Advantages accruing from the above arrangement will now be described. FIG. 14(a) illustrates variations in density of an image on a manuscript as it is read during the operation described above, and FIG. 14(b) shows a signal appearing at the output terminal 214 during one scanning operation. In FIG. 14(b), the level A is indicative of an output corresponding to a white region on the manuscript, the level B is indicative of an output corresponding to a black region on the manuscript, and the dot-and-dash line T1 indicates a threshold value for binary conversion of the signals. Variations in the outputs as shown result from the lack of uniformity of sensitivity of the amorphous silicon layer and the lack of uniformity of resistance of the transparent conductive thin film, which non-uniformities become higher as the image pickup devices are larger in size. The device of the present invention which utilizes amorphous silicon has a higher uniformity than that of conventional devices made of Se-Te-As, it has been found that the present driving process for driving the device is effective to gain an even higher signal-to-noise ratio.

Figure 14C:
FIG. 14(c) is illustrative of a signal read when the driving arrangement of the invention is not employed.
Figure 15:
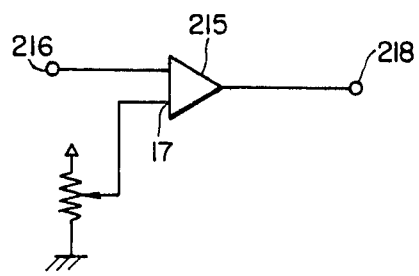
FIG. 15 is a circuit diagram of a conventional binarizing circuit.

No proper binary signals are available by supplying the outputs as shown in FIG. 14(b) to a known binarizing circuit as illustrated in FIG. 15. More specifically, when an output signal having variations in level as shown in FIG. 14(b) is delivered from the output terminal 14 to an input 216 of a comparator 215, and the other input 217 of the latter is supplied with a constant reference voltage serving as a threshold value, a signal appearing at an output terminal 218 of the comparator 215 has a portion which is not accurately converted to binary as shown in FIG. 14(c).

The above shortcoming can be overcome by utilizing the present driving process for generating a proper binary signal.

With the driving circuit according to the present invention, photosensitive devices in one block of the image pickup device are located closely to each other, and have small variations in characteristics and can be regarded as being uniform, with the result that a threshold voltage can be determined for the output from each block.

Figure 16:
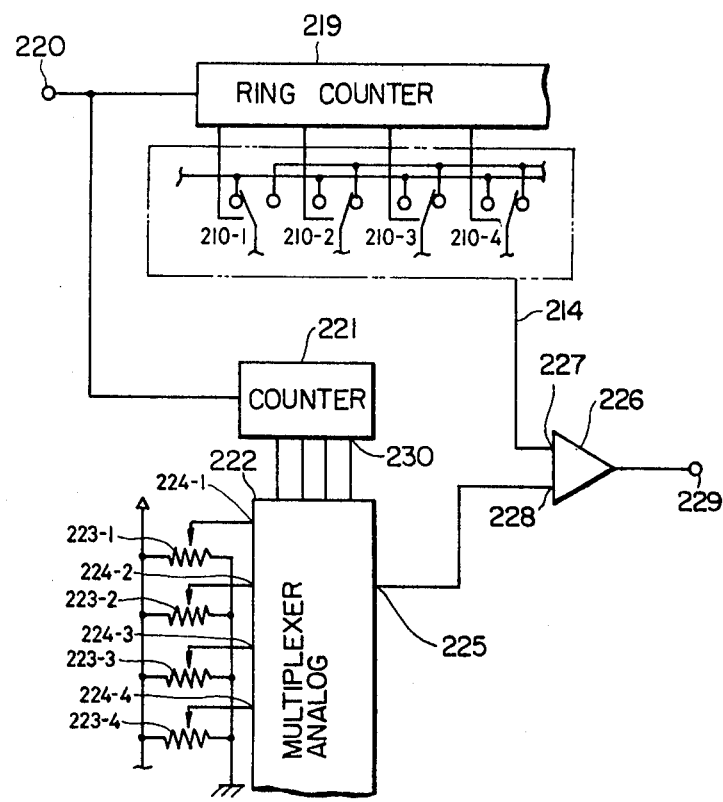
FIG. 16 is a block diagram of a third driving arrangement.

In FIG. 16, a section enclosed by the dotted lines corresponds to the image pickup device illustrated in FIGS. 12(A) and 12(B). Designated at 219 is a ring counter, 221 a counter, 222 an analog multiplexer, 223 a potentiometer, and 226 a comparator.

In the manuscript reader thus constructed, a binary signal can be generated as follows.

When clock pulses are supplied to an input terminal 220, the ring counter 219 is energized to turn on the voltage applying switches 210-1, 210-2, 210-3, . . ., successively. The clock pulses are simultaneously supplied to the counter 221, which then produces binary signals 230. Output voltages of the potentiometers 223-1, 223-2, . . . are successively selected by the binary signals 230. Thus, in synchronization with successive selection of the switches 210-1, 210-2, . . . by the ring counter 219, an output 225 of the analog multiplexer 222 which serves as a reference input to the comparator is selectively supplied with signals 224-1, 224-2, . . . .

The comparator 226 serves to convert the output 214 from the photosensitive devices to binary form and is supplied at an input 227 thereof with the output 214 fed from the image pickup device and at the input 228 with the voltage output 225 from the analog multiplexer 222. The comparator 226 compares the input 226 with the input 228 (threshold voltage) to produce a binary signal. Thus, binary signals for each of the blocks in the image pickup device are provided by selectively supplying individual threshold voltages for each of the blocks.

Figure 17A:
FIG. 17(a) is a view showing signal outputs and a threshold level attained by the driving arrangement of the invention.
Figure 17B:
FIG. 17(b) is illustrative of an output read by the driving arrangement of the invention.

To determine the proper threshold voltages for the blocks, the photosensitive devices in the blocks in a reader to be handled are measured in advance for their reading sensitivities (photoelectric output characteristics) in accordance with which the potentiometer 223 is adjusted. Alternatively, the threshold voltages could be empirically adjusted using a test document.

Where a signal indicative of a white region of a manuscript is at the level A, and a signal indicative of a black region of the manuscript is at a level B, as illustrated in FIG. 14(b), the potentiometers 223-1, 223-2, . . . , in FIG. 16 are adjusted to determine threshold voltages for the blocks which are at optimum values between the levels A and B. By thus setting threshold voltages between the output signals indicative of white and black regions, the threshold voltages as a whole are variable in a steplike manner as shown by the dot-and-dash line T2 in FIG. 17(a). As a result, a binary signal is produced as shown in FIG. 17(b), which is attributable to proper reproduction of a manuscript image in FIG. 14(b).

Figure 18:
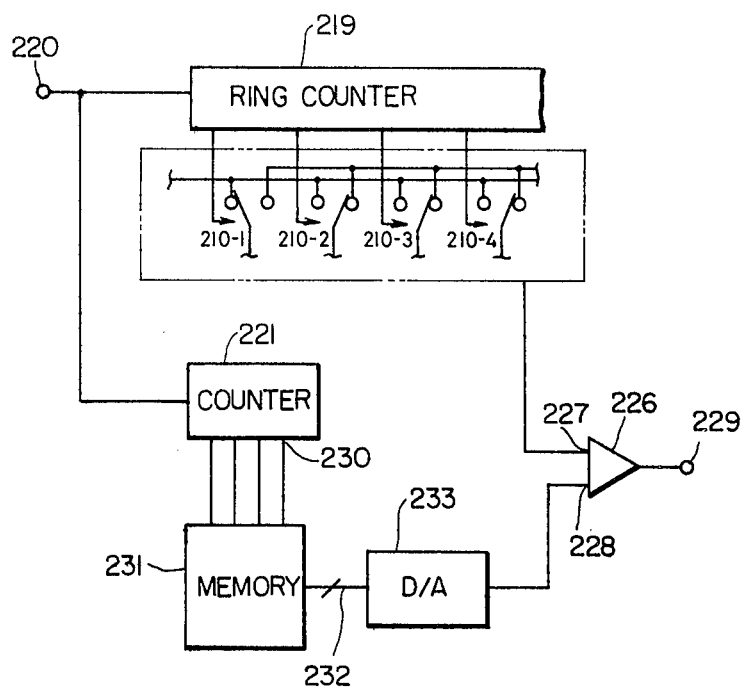
FIG. 18 is a block diagram of an arrangement which is a modification of the arrangement shown in FIG. 16.

FIG. 18 illustrates in block form another arrangement for driving the reader. The driving arrangement shown in FIG. 18 is different from that of FIG. 16 in that a memory 231 and a digital-to-analog converter 233 are used in place of the analog multiplexer 222 and the potentiometer 223.

A binarized signal for such a manuscript reader can be generated as follows.

Theshold voltages determined in the same manner as with the potentiometer 223 are converted into digital signals which are written into the memory 231 in advance. Then, clock pulses 220 are supplied to actuate the ring counter 219 and the counter 221. Binary signals from outputs 230 of the counter 221 are delivered as addressing signals for the memory 231, which produces as its output digital signals corresponding to the stored threshold voltages. The digital signals are converted by the digital-to-analog converter 233 into analog signals that are delivered as threshold voltages to the input 228 of the comparator 226. With the manuscript reader constructed as above, there are available threshold voltages which vary with the blocks so that proper binary conversion is always achieved.

The driving arrangement allows threshold voltages to be generated respectively for the blocks of image pickup devices so that outputs of the image pickup devices can properly be binarized even if they are not uniform. As a consequence, a reduction in yield can be prevented which would otherwise result from the difficulty in attaining uniform outputs from large-size image pickup devices.

Briefly summarized, the present invention is characterized by a plurality of metal electrode members deposited on an insulating substrate and divided into individual bits, a layer of amorphous silicon deposited flatwise on the plurality of metal electrode members, and a transparent electrode deposited flatwise on the layer of amorphous silicon in opposed relation to the divided metal electrode members.

The layer of amorphous silicon may be of i-type or p-type for an increased dark resistance. The photoconductive layer of amorphous silicon may be of a thickness of 0.5 to 5 $\mu$m, or preferably of 1 $\mu$m so as to reduct the inter-electrode distance by more than half that of conventional planar type devices, with the result that the reader will have an increased response speed.

By making a plurality of lower electrode members of Cr, or oxidizing the surface of the lower electrode which is in contact with the amorphous silicon layer, the surface held against the amorphous silicon can serve as a blocking layer for holes, resulting in a reduced dark resistance.

Blocks of reader devices are combined with blocks of light-emitting devices for selective operation at a low power requirement, resulting in a reduced number of switching elements and a lower manufacturing cost. An upper transparent electrode may be divided into blocks to correct variations in device sensitivities for rendering outputs uniform.

While the invention has been described in detail and with reference to specific embodiments thereof, it will be apparent to one skilled in the art that various changes and modifications can be made therein without departing from the spirit and scope thereof.

What is claimed is:

1. A manuscript reader of the type having a photosensitive device receiving incident light from said manuscript and changing its conductive state in accordance with said incident light, and a detection circuit for detecting the conductive state of said photosensitive device, said photosensitive device comprising:
   a substrate;
   a first electrode formed on said substrate;
   a photoconductive amorphous silicon film formed over said first electrode; and
   a second electrode formed over said silicon film, one of said first and second electrodes being transparent and receiving said incident light, and the other of said first and second electrodes being formed of a material selected from the group consisting of chromium and chromium having a layer of chromium oxide formed on a surface thereof contacted by said silicon film.

2. A manuscript reader as claimed in claim 1, wherein said amorphous silicon has a volume resistivity of at least substantially $10^{10}$ $\Omega$cm.

3. A manuscript reader as claimed in claim 1, wherein said second electrode comprises said one electrode.

4. A manuscript reader as claimed in claim 1, wherein said amorphous silicon is of i-type conductivity.

5. A manuscript reader as claimed in claim 1, wherein said amorphous silicon is of p-type conductivity.

6. A manuscript reader as claimed in claim 1, wherein said oxide layer is approximately 20 Å in thickness.

7. A manuscript reader as claimed in claim 1, wherein said silicon film is approximately between 0.5 $\mu$m and 5 $\mu$m in thickness.

8. A manuscript reader as claimed in claim 1, wherein the other of said first and second electrodes comprises a plurality of metal electrodes.

9. A manuscript reader as claimed in claim 8, wherein said one electrode comprises a plurality of transparent electrodes each juxtaposed with one of said plurality of metal electrodes.

10. A manuscript reader as claimed in claim 8, wherein said one electrode comprises one transparent electrode overlying a plurality of said metal electrodes.

11. A manuscript reader as claimed in claim 8, wherein said plurality of metal electrodes are divided into consecutive blocks with each block being separately illuminated and corresponding metal electrodes in different blocks being connected together.

12. A manuscript reader as claimed in claim 11, wherein corresponding metal electrodes in consecutive odd-numbered blocks are connected together and corresponding metal electrodes in consecutive even-numbered blocks are connected together.

13. A manuscript reader as claimed in either of claims 1 or 12, wherein said transparent electrode comprises a plurality of transparent electrodes each juxtaposed with one of said blocks of metal electrodes.

14. A manuscript reader as claimed in any one of claims 1, 8, 9, 10 or 11 or 12, wherein said detection circuit comprises means for comparing a signal received from said photosensitive device to a threshold level, and means for changing said threshold level during the course of a scanning operation.

* * * * *